United States Patent Office 3,690,882
Patented Sept. 12, 1972

3,690,882

PROCESSES AND ELEMENTS FOR PREPARATION OF PHOTOMECHANICAL IMAGES WITH CINNAMYLIDENE MALONATE COPOLYESTER

Wojciech M. Przezdziecki, Rochester, N.Y., assignor to Eastman Kodak Company, Rochester, N.Y.

No Drawing. Filed June 15, 1970, Ser. No. 46,526
Int. Cl. G03c *11/12*
U.S. Cl. 96—28 23 Claims

ABSTRACT OF THE DISCLOSURE

A dry process for the preparation of photomechanical images is described which employs as the photosensitive material a cinnamylidene malonate copolyester.

This invention relates to the preparation of photomechanical images. In a particular aspect it relates to elements and processes for preparing photoresists by processes involving uniform or imagewise transfer of a light sensitive polymer.

It is known in the photographic art to reproduce images by processes which involve imagewise exposure of a layer of a light-sensitive polymer, the physical properties of which are differentially modified by the action of radiation, and subsequent treatment of the layer to remove portions of the layer in accordance with its exposure to light. Such processes have been employed to prepare lithographic printing plates, stencils, photoresists, and similar photomechanical images.

The art has long recognized the need to transfer layers of such light sensitive polymer compositions from one support to another, and over the years many attempts have been made to work out practicable processes both for the transfer of entire layers of such materials as well as for the imagewise transfer of selected areas of such materials, from a temporary support to a second support. The transfer of a complete layer is desirable because it permits the in-plant coating of uniform, heavy layers while avoiding many of the difficulties encountered with on-site preparation of such layers. Problems with solvent evaporation, uniformity, and coating thickness are much more easily controlled during manufacture than they can be locally. Similarly, the imagewise transfer of areas of the layer making use of photothermographic properties of the light sensitive polymer coating permits the preparation of polymer images in desired patterns by simple convenient means which avoids the solvent development step generally employed in the preparation of photomechanical images.

It is an object of this invention to provide novel processes for the preparation of photomechanical images.

It is another object of this invention to provide novel, dry processes for the preparation of photomechanical images by the imagewise transfer of light sensitive polymer layers which avoid the use of solvents to develop an image.

It is yet another object of this invention to provide processes for the preparation of photomechanical images which involve the uniform transfer of layers of light sensitive polymer.

It is a further object of this invention to provide novel photosensitive elements containing light sensitive polymer layers which are useful in the processes of this invention.

The above and other objects of this invention will become apparent to those skilled in the art from the further description of the invention which follows.

This invention provides novel processes for the preparation of photomechanical images employing novel photosensitive elements containing a layer of a light sensitive cinnamylidene malonate copolyester. The processes of this invention include the steps of (1) adhering to a receptor surface, by the application of heat and pressure, an unexposed photosensitive cinnamylidene malonate copolyester which is carried on a strippable support to which the unexposed copolyester adheres with less force than it adheres to the receptor surface, (2) cooling the copolyester to room temperature, and (3) removing the strippable support from the unexposed copolyester to leave unexposed photosensitive copolyester on the receptor surface.

The photosensitive cinnamylidene malonate copolyester can be exposed to an imagewise pattern of actinic radiation at several points in the process with varying results. It can be exposed while it is on the strippable support prior to its being adhered to the receptor surface; in which case, after adhering, cooling and removing the strippable support, an imagewise distribution of the unexposed copolyester remains on the receptor surface while the exposed copolyesters stays with the strippable support. This is a positive working process since the polymer image remaining on the receptor surface corresponds to the areas of greatest density, i.e., the image areas, of the transparency to which the layer was exposed. Alternatively the copolyester can be exposed subsequent to its being adhered to the receptor surface. Whether this exposure precedes removal of the strippable support or follows removal of the strippable support, a uniform layer of copolyester remains on the receptor surface, and an image can be obtained by standard techniques such as solvent development. Generally, this will be a negative working process.

Hence, both positive or negative working processes can be utilized to prepare photomechanical images in accordance with the present invention. These processes have in common the steps of adhering the cinnamylidene malonate copolyester to the receptor surface using heat and pressure, cooling the copolyester to room temperature and removing the strippable support from the copolyester layer.

The cinnamylidene malonate copolyester is adhered to the receptor surface by bringing the surface of the unexposed cinnamylidene malonate copolyester layer, carried on the strippable support, in contact with the receptor surface while applying heat and pressure. This causes unexposed cinnalymidene malonate copolyester to adhere to the receptor surface with greater force than it adheres to the strippable support. Good results are obtained when the layer is heated to a temperature in the range of 80° to 150° C. and a pressure of 16 to 80 pounds per square inch is applied.

A highly useful procedure for applying heat and pressure is by passing the sandwich formed by the strippable support, the cinnamylidene malonate copolyester and the receptor surface through one or more pairs of rollers. Such rollers can comprise one metal roll, such as an aluminum or stainless steel roll, and one resilient roll, such as a rubber roll having a steel core. The light sensitive cinnamylidene malonate copolyester layer can be heated just prior to its passing through the rollers or the entire sandwich can be heated by means of heated rollers. The rollers can be heated internally, externally or by a combination of both. Pressure can be applied to the sandwich as it passes through the nip of the rollers. If heating is by means of rollers two pair of rollers can be utilized, one to provide the heat and the second to apply pressure to the heated sandwich, or both heat and pressure can be applied by a single pair of rollers. Pressure can be applied by spring loading the rollers at their ends. Useful results are obtained when force is applied at a rate of 4 to 20 pounds of force per linear inch of roller length. Suitable equipment for adhering the cinnamylidene malonate copolyester to the receptor surface is described, for example, in Dulmage et al. in U.S. Pat. 3,260,612 and Light et al., U.S. Pat. 3,261,023.

It is important that the copolyester layer be allowed to cool to room temperature (i.e. 25 to 30° C.) before the strippable support is removed. If the support is removed prior to the copolyester layer cooling sufficiently, it has been found that portions of unexposed cinnamylidene malonate copolyester are often removed with the strippable support, thus resulting in non-uniform coatings or discontinuities in the image areas. In removing the strippable support, best results are generally obtained if the strippable support is removed at an acute angle relative to the sandwich; almost folded back upon itself. Since the strippable support is generally a flexible sheet of film and the receptor surface is generally a relatively rigid sheet of metal, this procedure not only gives the best results, but is the easiest to effect.

As indicated previously, the cinnamylidene malonate copolyester can be imagewise exposed prior to its being adhered to the receptor surface, it can be imagewise exposed after being adhered to the receptor surface but prior to removal of the strippable support, or it can be imagewise exposed after removal of the strippable support. Exposure is generally to a source rich in ultraviolet radiation although visible light sources can also be employed. Exposure times of from several seconds to several minutes or longer are satisfactory. The most suitable exposure conditions will vary depending upon the particular light sensitive copolyester employed, the sensitizers used, if any, the thickness of the light sensitive layer, the image to which the light sensitive layer is being exposed, whether the light sensitive layer is exposed through the strippable support or on its face, etc. Those skilled in the art can readily determine the best exposure taking into account such factors as those mentioned above.

If the cinnamylidene malonate copolyester layer is imagewise exposed to actinic radiation prior to laminating it to the receptor surface, after it is laminated, the cinnamylidene malonate copolyester adheres to the strippable support in exposed areas with greater force than it adheres to the receptor surface, while the copolyester in unexposed areas adheres to the receptor surface with greater force than it adheres to the strippable support. If the copolyester layer has not been given any exposure, it adheres uniformly with greater force to the receptor surface than it adherese to the strippable support.

Upon removal of the strippable support, and, as indicated above, depending upon when the light sensitive copolyester layer is exposed, there is obtained either an imagewise distribution or a uniform distribution of the copolyester on the receptor suface. The uniform distribution of copolyester either will comprise hardened exposed areas alternating with non-exposed, light sensitive areas, if the copolyester layer has been imagewise exposed prior to stripping, or, if the copolyester layer has not been imagewise exposed, it will comprise only light sensitive copolyester.

The imagewise distribution of copolyester is still light sensitive and it can be further imagewise exposed if desired, for example, after the imagewise distribution is used as an etching resist, selected areas can be imagewise exposed and developed to allow further operations to be performed on the receptor surface. If this type of operation is to be carried out, the imagewise distribution of light sensitive copolyester must be protected from insolubilizing radiation.

Where there is a uniform distribution of copolyester, an image is formed by imagewise exposure, if this has not been done previously, followed by standard development techniques such as solvent washout of the copolyester in unexposed areas with a solvent therefor which is a nonsolvent for the copolyester in exposed areas.

The cinnamylidene malonate copolyesters which are useful in preparing the light sensitive layers employed in the present invention comprise the condensation product of at least one dihydroxy reactant with a mixture of diacid reactants, from 30 to 95 mole percent of the mixture being a cinnamylidene malonate reactant, such as a cinnamylidene malonic acid or a bis-ester of a cinnamylidene malonic acid, and the remainder of the mixture being at least one non-light sensitive aromatic dicarboxylate reactant, such as aromatic dicarboxylic acids or dicarboxylic acid bis-esters. Preferably, the cinnamylidene malonate reactant constitutes about 30 to 70 mole percent of the diacid reactants. The polyester should have an inherent viscosity greater than about 0.1 and preferably has an inherent viscosity of between about 0.3 and 0.6. The values for inherent viscosity given herein are measured at a concentration of 0.25 gram polyester per deciliter of solvent in a 1:1 mixture of phenol and chlorobenzene at 25° C.

Suitable cinnamylidene malonate reactants can be represented by the formula:

(I)
```
ROOC—C—COOR
     ‖
     CH
     |
     CH
     ‖
     R1
```

wherein R is a hydrogen atom or a lower alkyl group of 1 to 4 carbon atoms, e.g., methyl, ethyl, n-propyl, isopropyl, n-butyl, sec-butyl, and t-butyl, preferably R is a methyl group; and $R_1$ is an alkylidene, aralkylidene or heterocyclic group which is free of functional substituents (i.e., free of substituents which can interfere with a polyesterification reaction), for example, $R_1$ can be an ethylidene, benzylidene, quinolylidene, benzothiazolylidene, or the like group; preferably $R_1$ is a benzylidene group.

Examples of light-sensitive dicarboxylic acids, which can be used, or the bis-esters of which can be used, to prepare the light sensitive copolyesters include cinnamylidenemalonic acid, crotylidenemalonic acid, γ-methylcrotylidenemalonic acid, o-nitrocinnmaylidenemalonic acid, naphthylallylidenemalonic acid, 2-furfurylidenemalonic acid, N-methylpyridylidene - 2 - ethylidene - malonic acid, N-methylquinolylidene - 2 - ethylidenemalonic acid, N-methylbenzothiazolylidene-2-ethylidenemalonic acid, and the like.

Suitable dihydroxy reactants can be represented by the formula:

(II) $$HO—R_2—OH$$

where $R_2$ represents a hydrocarbon group such as an alklylene group having 2 to 12 carbon atoms, e.g., an ethylene, propylene, butylene, amylene, hexylene, decylene, dodecylene, or the like group, including cycloalkylene groups such as cyclohexylene, ethoxycyclohexylene, or the like groups, such as cyclohexylene, ethoxycyclohexylene, or the like groups, or an arylene group of the benzene and naphthalene series as phenylene, naphthylene, phenylenedimethylene, or the like groups; preferably $R_2$ is a lower alkylene group having 2 to 5 carbon atoms.

Examples of suitable dihydroxy reactants which are useful in preparing the copolyester include aliphatic diols such as alkylene glycols containing about 2 to 12 carbon atoms, for example, ethylene glycol, diethylene glycol, triethylene glycol, 1,3-propanediol, 1,2-propanediol, 1,4-butanediol, 2,3-butanediol, 1,5-pentanediol, 2,2-dimethyl-1,3-propanediol cyclohexanedimethanol decamethylene glycol dodecamethylene glycol, and aromatic diols for example, hydroquinone, p-(dihydroxymethyl)benzene, etc.

Suitable non-light-sensitive aromatic dicarboxylic acid reactants can be represented by the formula:

(III) $ROOC—R_3—COOR$ where R is as defined above and $R_3$ is an arylene group of the benzene or naphthalene series such as an m- or p-phenylene group, a 1,3- or 1,4-naphthylene group or the like.

As examples of preferred non-light sensitive aromatic dicarboxylic acids, there can be mentioned terephthalic acid, isophthalic acid, phthalic acid, and the like.

The light-sensitive cinnamylidenemalonate copolyesters which are useful in this invention can be represented as being composed of the following repeating units:

(IV)

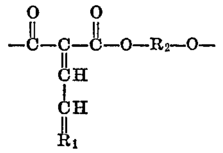

and (V)

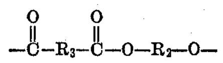

wherein $R_1$, $R_2$ and $R_3$ are as defined above.

These copolyesters can be prepared by conventional polyesterification of ester interchange procedures. Suitable copolyesters and processes for preparing them are described in Laakso and Van Nice U.S. patent application Ser. No. 19,064 filed Mar. 12, 1970 and in Phlipot, Michiels and De Villenueve U.S. patent application Ser. No. 19,603 filed Mar. 12, 1970.

Particularly preferred are the cinnamylidene maleonate copolyesters prepared from monomers which have been purified by fractional distillation or fractional crystallization, such as the polyesters described in the aforementioned Laakso et al., U.S. patent application Ser. No. 10,064 filed Mar. 12, 1970.

Coating compositions from which the copolyester can be coated onto the strippable support can be prepared by dispersing or dissolving the copolyester in a suitable solvent or combination of solvents used in the art to prepare polymer dopes. Solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as dimethylformamide and dimethylsulfoxide; and mixtures of these solvents. Typically the light-sensitive copolyester is employed in the coating composition in the range from about 1 to 20 percent by weight. Preferably the copolyester comprises 2 to 10 percent by weight of the composition in a solvent such as listed above.

Although the copolyesters are sufficiently light sensitive to be useful without additional sensitization, it is preferred to increase their photosensitivity by adding suitable sensitizers to the coating composition.

Suitabl compounds that can be as sensitizers include 2-(benzoylmethylene)-1-methyl - β - naphthothiazoline, 2-benzoylcarbethoxymethylene-1-methyl - β - naphthothiazoline, 1-carbethoxy-2-keto-3-methyl - 2 - azabenzanthrone, rosin, etc. Other sensitizers are described, for example, in French Pat. No. 1,086,257 of Jan. 19, 1952, French Pat. No. 1,089,290 of Oct. 14, 1953, U.S. Pat. 2,610,120 (nitro compounds), U.S. Pat. 2,600,966 (triphenylmethanes), U.S. Pat. 2,670,285 (anthrones), U.S. Pat. 2,670,287 (diaminobenzophenone imide, -diphenylmethanes, -diphenyl ketones, -diphenylcarbinols), U.S. Pat. 2,670,286 (quinones), and U.S. Pat. 2,732,301 (thiazoles, thiazolines, cyanine dyes, etc.). Also, it has been found that photosensitive products of especially high speeds are obtained when methyl-2-(N-methylbenzothiazolylidene)-dithioacetate is used as the sensitizer.

The copolyesters can be coated onto the strippable support by solvent techniques in accordance with usual practice or by coating from the melt. Dry coating thicknesses of between about 0.1 and 2 mils are suitable for most purposes.

The strippable support should be selected so that the unexposed copolyester adheres to it with less force than to the receptor surface. Useful supports are those to which the unexposed copolyester adheres with low to moderate force. Such materials can be selected from fiber based materials such as paper, polymer coated paper such as polyethylene coated paper, polypropylene coated paper, and the like, synthetic polymeric materials such as polyalkylmethacrylates, e.g., polymethylmethacrylate, polyester film base, e.g., polyethylene terephthalate, polyvinyl acetals, polyamides, e.g., nylon, polyolefins such as polyethylene, polypropylene, etc. and the like. Of course, the choice of a particular strippable support will depend, to a certain extent, upon the receptor surface with which the light sensitive layer is to be used. A partciularly preferred strippable support for use with metallic receptor surface is polyethylene terephthalate.

In one embodiment of this invention the polyethylene terephthalate strippable support is unsubbed polyethylene terephthalate. In another embodiment of this invention the preferred polyethylene terephthalate strippable support has a subcoating of a swellable, electrically insulating polymeric material which adheres to the strippable support. Useful subcoating material includes polyesters having both aromatic and aliphatic constituents such as those formed with both aromatic and aliphatic dibasic acids, for example a polyester of ethylene glycol and terephthalic and sebacic acids; polyvinyl acetals such as those produced by hydrolyzation of polyvinyl acetate followed by acetalization with formaldehyde or acetaldehyde, for example polyvinyl formal; hydrosol terpolymers, which are three component addition type co-polymers prepared by aqueous emulsion co-polymerization, containing vinylidene chloride as a major constituent, such as a terpolymer of methyl acrylate, vinylidene chloride and itaconic acid as disclosed in U.S. Pat. No. 3,143,421. Other useful materials would also include the so-called tergels which are the subject matter of copending Nadeau et al., U.S. application Ser. No. 597,669, filed Nov. 29, 1966, now U.S. Pat. 3,501,301.

However, when a subcoating is employed on the polyethylene terephthalate support, in order to obtain proper adhesion of the light sensitive copolyester layer it is necessary to interpose between the subcoating and the light sensitive copolyester layer a release layer. This release layer constitutes a polymer which has a slow rate of recrystallization after heating. Suitable such polymers include the light sensitive polyesters and copolyesters described in U.S. Pat. 3,030,208 and Allen U.S. application Ser. No. 709,496 filed Feb. 29, 1968, now U.S. Pat. 3,622,320, as well as the non-light sensitive polymer described in U.S. Pat. 3,342,623. This release layer can be coated on the subbed polyethylene terephthalate support by procedures similar to that employed to coat the light sensitive copolyester layer on the strippable support.

Preferably the release layer is applied to the support at a rate of 0.08 to 0.2 gram per square foot of support.

As indicated above the release layer can be coated on the subbed strippable support by conventional solvent coating techniques. However, it has been found that if the light sensitive copolyester layer is then coated onto the release layer from a solvent, intermixing of the light sensitive layer and the release layer occurs making it difficult to effect successful transfer of the light sensitive layer from the strippable support to the receptor surface. This intermixing can be avoided by preparing the element in special ways.

One procedure involves coating the light sensitive copolyester on a temporary support, which can be an unsubbed polyethylene terephthalate support or another flexible polymer layer, and then laminating the light sensitive copolyester layer to the release layer carried on the strippable support. The conditions of lamination and the equipment used can be the same as employed to adhere the light sensitive copolyester layer to the receptor surface. Similarly, the light sensitive copolyester layer is allowed to cool before the temporary support is stripped from the element. This procedure can be employed when the release layer is prepared either from a light sensitive polyester or from a non-light sensitive polyester.

An alternative procedure, which can be employed when the release layer is prepared from a light sensitive polymer, involves giving the light sensitive release layer an overall flash exposure sufficient to harden just the surface of the release layer, and then coating the light sensitive copolyester layer over the release layer by standard solvent coating techniques. The flash exposure renders the release layer insoluble in the coating solvents employed for the light sensitive copolyester and hence prevents intermixing of the two layers. This latter procedure permits in-line coating of the element on the strippable support.

The following examples further illustrate this invention.

In these examples the dihydric alcohols used to prepare the polyesters are described in terms of the carbon chain length, for example, $C_2$ represents ethylene glycol and $C_4$ represents butanediol. The relative amounts of the dihydric alcohols are given by the number following the chain length designation, for example, $C_2 95 C_4 5$ represents a mixture composed of 95 percent ethylene glycol and 5 percent butanediol.

The diacid reactants are described in terms of the particular compounds used. The light-sensitive component, cinnamylidene malonate, is abbreviated CM. The non-light-sensitive component is abbreviated DMT for dimethyl terephthalate or DMIT for dimethyl isoterephthalate. The relative proportions of each are designated in the same manner as the dihydric alcohol.

EXAMPLE 1

Resist image transfer

A sensitized solution is prepared having the following composition:

| | Grams |
|---|---|
| ($C_2 95+C_4 5$+DMT35+CM65) | 100.0 |
| Methyl-1-(N - methylbenzothiazolylidine dithioacetate (BTTA) | 5.0 |
| Methyl ethyl ketone to 400.0 ml. | |

The solution is filtered through a 5-micron filter and coated at 5 ml. per square foot on 4 mils unsubbed polyethylene-terephthalate film support. The dried coating is exposed through a positive test pattern to Nu-Arc FT. 26 AM Flip Top Plate Maker at a setting of 4 units (a mercury vapor light source). The exposed coating is placed on a piece of anodized aluminum and passed through a pair of heated pressure rollers set at 90° C. and a pressure of 40 pounds per square inch. After emerging from the rollers, the sandwich is allowed to cool down to room temperature after which the strippable poly(ethylene terephthalate) support is removed, taking with it exposed areas of the coating and leaving on the aluminum a positive resist image comprising the unexposed areas of the coating.

EXAMPLE 2

Transfer of a dyed image

A sensitized solution is prepared having the following composition:

| | Grams |
|---|---|
| ($C_2 95+C_4 5$+DMT35+CM65) | 4.0 |
| BTTA | 0.2 |
| Rhodanine 6G, CI #752 | 0.04 |
| Dichloromethane to 20.0 ml. | |

The solution is coated, dried, exposed and processed as in Example 1. A dyed resist image is obtained on the aluminum receptor surface.

EXAMPLE 3

Comparison of hot stripping versus cold stripping

A sensitized solution is prepared having the following composition:

| | Grams |
|---|---|
| ($C_2 95+C_4 5$+DMIT35+CM65) | 20.0 |
| BTTA | 0.2 |
| 2-ethoxyethyl acetate to 100.0 ml. | |

This solution is coated on unsubbed poly(ethylene terephthalate) film base at a wet thickness of 4 mils and is thoroughly dried. The dry coating is exposed through a test pattern as in Example 1. The exposed layer is placed in contact with a sheet of anodized aluminum and the sandwich is passed through heated rollers at a temperature of 90° C. and under a pressure of about 20 pounds per square inch. The first half of the poly(ethylene terephthalate) support is stripped immediately on emerging from the nip of the rollers. The other half is left to cool down to room temperature before it is removed. Only partial transfer of the unexposed areas of the coating takes place on the first half of the sandwich where stripping is carried out hot. Complete transfer of the unexposed areas takes place on the second half of the sandwich where cold stripping is employed.

EXAMPLE 4

Resist layer transfer

An entire layer of a light-sensitive coating prepared as in Example 1 is transferred by application of heat and pressure followed by cold stripping, as described in Example 1 to a sheet of anodized aluminum. The transferred layer is then exposed through a negative test object in the platemaker used in Example 1, at a setting of 2 units after which the element is developed in a trichloroethylene vapor degreaser fitted with a spray. This example illustrates the utilization of the thermally transferred coating for subsequent imagewise exposure and conventional development.

EXAMPLE 5

Coatings are prepared as in Example 2 except that the sensitizer is 2,6-bis(4-ethylphenyl)-4-(4-amyloxyphenyl)-thiapyrylium perchlorate and is present in amounts of 1, 2 and 4 weight percent, based on the weight of the polymer. These coatings show increased sensitivity to light and perform well both in the image transfer of Examples 1 and 2, and the layer transfer procedure of Example 4.

EXAMPLES 6–27

A series of coatings are prepared according to the formula:

| | Grams |
|---|---|
| Polymer | 20.0 |
| BTTA | 0.2 |
| 2-ethoxyethyl acetate to 100.0 mils. | |

and coated on unsubbed poly(ethylene terephthalate) film base at 4 mils wet thickness.

| | Polymer composition | Inherent viscosity |
|---|---|---|
| Example: | | |
| 6 | $C_2$95+$C_4$5+DMT+CM65 | 0.87 |
| 7 | $C_2$100+DMT35+CM65 | 0.78 |
| 8 | $C_2$95+$C_4$5+DMIT35+CM65 | 0.28 |
| 9 | $C_2$95+$C_4$5+DMIT35+CM65 | 0.35 |
| 10 | $C_2$95+$C_4$5+DMIT35+CM65 | 0.49 |
| 11 | $C_2$95+$C_4$5+DMIT35+CM65 | 0.54 |
| 12 | $C_2$95+$C_4$5+DMIT35+CM65 | 0.63 |
| 13 | $C_2$50+$C_4$50+DMT35+CM65 | 0.43 |
| 14 | $C_2$50+$C_4$50+DMT35+CM65 | 0.78 |
| 15 | $C_4$100+DMT35+CM65 | 0.84 |
| 16 | $C_2$50+$C_4$50+DMIT35+CM65 | 0.38 |
| 17 | $C_2$50+$C_4$50+DMIT35+CM65 | 0.76 |
| 18 | $C_2$50+$C_4$50+DMIT35+CM65 | 0.70 |
| 19 | $C_2$50+$C_4$50+DMIT35+CM65 | 0.52 |
| 20 | $C_2$50+$C_4$50+DMIT35+CM65 | 0.37 |
| 21 | $C_2$50+$C_4$50+DMIT35+CM65 | 0.64 |
| 22 | $C_2$50+$C_4$50+DMT16+CM84 | 1.14 |
| 23 | $C_2$50+$C_4$50+DMT16+CM84 | 0.86 |
| 24 | $C_2$95+$C_4$5+DMT35+CM65 | 0.57 |
| 25 | $C_2$50+$C_4$50+DMT16+CM84 | 1.06 |
| 26 | $C_2$50+$C_4$50+DMT16+CM84 | 0.69 |
| 27 | $C_2$95+$C_4$5+DMT16+CM84 | 0.66 |

All these coatings are found to be suitable for use in the photothermographic transfer process described in the preceding examples.

EXAMPLE 28

Element prepared with a subbed support and stripping layer

Element A.—A light-sensitive layer is prepared by coating at 5.0 ml. per square foot on an unsubbed polyethylene terephthalate support the following solution:

| | G. |
|---|---|
| Polymer of Example 1 | 100.0 |
| Thiapyrylium salt of Example 5 | 5.0 |
| 1,2-dichloroethane to 500.0 ml. | |

Element B.—A sheet of polyethylene terephthalate film base subbed with a terpolymer of methacrylic acid, vinylidene chloride and itaconic acid, as described in U.S. Pat. 2,627,088 is coated at 2.0 mils wet thickness with a solution of a poly(pentaazelate/pentamethylene benzene diacrylate) (67.5/37.5), prepared as described in U.S. Ser. No. 709,496, filed Feb. 29, 1968, containing 22 percent solids and having an inherent viscosity 0.5. This latter polyester layer constitutes a release layer to which the resist layer is applied. To produce the two-layer dry resist film, the light-sensitive layer of Element A is transferred to Element B by passing the elements through heated pressure rollers as described in Example 1. After lamination, the sandwich is allowed to cool and the unsubbed polyester support is stripped and discarded.

EXAMPLE 29

Use of the element of Example 28

The two-layer element prepared in Example 28 is exposed through a positive test pattern as described in Example 1. The exposed coating is placed in contact with a sheet of anodized aluminum and the sandwich is passed through a pair of heated pressure rollers at 110° C. and a pressure of 40 pounds per square inch. After emerging from the rollers, the laminate is allowed to cool down (2 minutes) at which time the subbed polyethylene terephthalate support is stripped taking with it most of the release layer and the exposed areas of the resist coating and leaving on the aluminum a positive resist image of excellent quality.

EXAMPLE 30

Alternative stripping layer

Element A.—As in Example 28.

Element B.—As in Example 28, but the release layer is a non-light sensitive polymer, copoly(1,4-cyclohexane dimethylene adipate/azelate) (3/1). The two-layer material is prepared, exposed and processed as in Example 29. The temporary support carrying the non-light-sensitive stripping layer and the exposed areas of the resist coating is peeled off after about 2 minutes delay. An excellent quality resist image is left on the aluminum receptor surface.

EXAMPLE 31

Alternative preparation of element with subbed support and stripping layer

A sheet of polyethylene terephthalate film base, subbed as in Example 28, is coated at a coverage of 0.8 gram per square foot with polymer used for the release layer in Example 28. The layer is allowed to dry and it is then flash exposed to a 400 watt pulsed xenon lamp at a distance of 15 inches for from about 0.2 to 100 seconds to harden the surface of the layer without crosslinking it in depth. The light sensitive cinnamylidene malonate copolyester coating composition used in Example 28 is then coated over the release layer without adverse intermixing of the two layers. The resulting element can be used as in Example 29 to prepare resist images of good quality.

EXAMPLE 32

Comparison of resist films with and without stripping layers

Element A.—A light-sensitive layer is prepared by coating the following solution at 5 ml. per square foot on unsubbed polyethylene terephthalate film base:

| | G. |
|---|---|
| Polymer of Example 1 | 200.0 |
| Epoxy resin (Epon 1004 sold by Shell) | 10.0 |
| Sensitizer of Example 5 | 10.0 |
| 1,2-dichloroethane to make 1000.0 ml. | |

Element B.—A solution containing 8 percent by weight of poly(pentaazelate/pentamethylene benzene diacrylate) (67.5/32.5) is coated at 2 ml. per square foot on a polyester support subbed as in Example 28. A comparison of image quality is carried out using the light sensitive layer coated directly on unsubbed base (Resist Film A) and a film produced by transfer of the light-sensitive layer of element onto Element B as in Example 28 (Resist Film B). The two light-sensitive resist films are exposed through an original screen pattern consisting of 120, 133, and 150 lines per inch and covering dot sizes from about 5 to 90 percent. After exposure, the films are placed on cleaned, flexible copper/plastic laminates and then passed through a pair of heated pressure rollers at 110° C. and 30 pounds per square inch pressure. After emerging from the rollers, the sandwiches are allowed to cool to room temperature and then the polyester supports are peeled off. On inspection of the transferred images, the following is observed:

Resist transferred from Resist Film A.—Dots up to less than 50 percent (that is, smaller than "chess-board" dots) transferred successfully to the copper support. In areas having 50 percent and larger dot areas, complete transfer to the new support took place, so no pattern resulted.

Resist transferred from Resist Film B.—Clean and satisfactory resist images corresponding to the original are transferred to copper in all dot area patterns. There is no unwanted transfer of the complete area as occurs with Resist Film A for large dot areas.

The invention has been described in detail with particular reference to preferred embodiments thereof, but it will be understood that variations and modification can be effected within the spirit and scope of the invention.

What is claimed is:

1. A process for preparing a photomechanical image which includes the steps of (a) adhering to a receptor surface, by the application of heat and pressure, unexposed photosensitive cinnamylidene malonate copolyester carried on a strippable support to which the unexposed copolyester adheres with less force than it adheres to the receptor surface, the cinnamylidene malonate copolyester being the condensation product of at least one dihydroxy reactant with a mixture of diacid reactants, from 30 to 95 mole percent of the mixture being a cinnamylidene malonate reactant and the remainder of the mixture being at least one non-light sensitive aromatic dicarboxylate reactant, (b) cooling the copolyester to room temperature, and (c) removing the strippable support from the unexposed copolyester to leave unexposed photosensitive copolyester on the receptor surface.

2. A process as defined in claim 1 further comprising the step of exposing the cinnamylidene malonate copolyester to an imagewise pattern of actinic radiation.

3. A process as defined in claim 2 wherein exposure precedes removing the strippable support.

4. A process as defined in claim 2 wherein exposure is subsequent to removing the strippable support.

5. A process as defined in claim 2 wherein exposure precedes adhering the copolyester to the receptor surface.

6. A process as defined in claim 5 wherein subsequent to removing the strippable support, the unexposed photosensitive copolyester remaining or the receptor surface is further exposed to actinic radiation.

7. A process as defined in claim 1 wherein, after removing the strippable support, the unexposed cinnamylidene malonate copolyester constitutes a continuous layer carried on the strippable support.

8. A process as defined in claim 1 wherein, prior to being adhered to the receptor surface, the unexposed cinnamylidene malonate copolyester forms a continuous layer with, and is complementary to, adjacent areas of imagewise exposed, photo-insolubilized cinnamylidene malonate copolyester.

9. A process as defined in claim 1 wherein adhering the unexposed cinnamylidene malonate copolyester to the receptor surface is accomplished by contacting the cinnamylidene malonate copolyester with the receptor surface and passing the sandwich thus formed through heated pressure rollers.

10. A process as defined in claim 1 wherein the non-light sensitive aromatic dicarboxylate reactant is selected from the group consisting of terephthalic acid, isophthalic acid and bis-esters thereof.

11. A process as defined in claim 1 wherein the dihydroxy reactant is an alkylene glycol of 2 to 12 carbon atoms.

12. A process as defined in claim 1 wherein the cinnamylidene malonate reactant is a lower alkyl bis-ester of cinnamylidene malonic acid, and comprises from 30 to 70 mole percent of the mixture.

13. A process as defined in claim 1 wherein the cinnamylidene malonate copolymer has an inherent viscosity between about 0.3 and 0.6.

14. A process as defined in claim 1 wherein adhering of the unexposed cinnamylidene malonate copolyester to the receptor surface is accomplished at a temperature of between about 80° and 150° C. and a pressure of 16 to 80 pounds per square inch.

15. A process as defined in claim 14 wherein adhering of the unexposed cinnamylidene malonate copolyester to the receptor surface is accomplished by passing the sandwich formed by contacting the cinnamylidene malonate copolyester with the receptor surface through heated pressure rollers.

16. A process as defined in claim 1 wherein the strippable support is a sheet of unsubbed polyethylene terephthalate.

17. A process as defined in claim 1 wherein the strippable support is a subbed polyethylene terephthalate support coated with a release layer of a polymer which has a slow rate of recrystallization after heating.

18. A process as defined in claim 1 wherein the receptor surface is a metallic sheet.

19. A process as defined in claim 17 wherein the receptor surface is an aluminum sheet.

20. A process for preparing a photomechanical image which comprises the steps of (a) exposing to an imagewise pattern of actinic radiation a photosensitive cinnamylidene malonate copolyester carried on a polyethylene terephthalate strippable support, the cinnamylidene malonate copolyester having an inherent viscosity of about 0.3 to 0.6 and being the condensation product of at least one alkylene glycol of 2 to 12 carbon atoms with a mixture of 30 to 70 mole percent of a lower alkyl bis-ester of cinnamylidene malonic acid and 70 to 30 mole percent of a lower alkyl bis-ester of terephthalic acid;

(b) adhering to a metallic receptor surface, by the application of heat and pressure, unexposed cinnamylidene malonate copolyester;

(c) cooling the copolyester to room temperature; and (d) removing the strippable support from the unexposed copolyester, to leave unexposed photosensitive copolyester on the receptor surface and retain exposed copolyester on the strippable support.

21. An element for use in preparing photomechanical images which comprises a subbed polyethylene terephthalate support, a layer of a photosensitive cinnamylidene malonate copolyester and between the subbed support and the photosensitive layer a release layer of a polymer which has a slow rate of recrystallization after heating.

22. An element as defined in claim 21 wherein the cinnamylidene malonate copolyester is the condensation product of at least one dihydroxy reactant with a mixture of diacid reactants, from 30 to 95 mole percent of the mixture being a cinnamylidene malonate reactant and the remainder of the mixture being at least one non-light sensitive aromatic dicarboxylate reactant.

23. An element as defined in claim 22 wherein the dihydroxy reactant is an alkylene glycol of 2 to 12 carbon atoms, the cinnamylidene malonate reactant comprises 30 to 70 mole percent of the mixture and is a lower alkyl ester of cinnamylidene malonic acid and the non-light sensitive aromatic dicarboxylate reactant is selected from the group consisting of terephthalic acid, isophthalic acid and bis-esters thereof.

References Cited

UNITED STATES PATENTS

| | | | |
|---|---|---|---|
| 2,956,878 | 10/1960 | Michiels et al. | 96—33 |
| 3,100,702 | 8/1963 | Rauner et al. | 96—33 |

FOREIGN PATENTS

| | | |
|---|---|---|
| 1,128,850 | 8/1966 | England. |

NORMAN G. TORCHIN, Primary Examiner

J. L. GOODROW, Assistant Examiner

PO-1050
(5/69)

UNITED STATES PATENT OFFICE
CERTIFICATE OF CORRECTION

Patent No. 3,690,882 Dated September 12, 1972

Inventor(s) Wojciech M. Przezdziecki

It is certified that error appears in the above-identified patent and that said Letters Patent are hereby corrected as shown below:

Column 3, line 59, "adherese" should read --adheres--.

Column 5, line 49, "maleonate" should read --malonate--; line 53, Serial No. "10,064" should read --19,064--.

Column 6, line 1, "suitabl" should read --suitable--; line 1, after "be insert --used--; line 5, "rosin" should read --eosin--; line 8, U. S. Patent "2,600966", should read --2,690,966--; line 36, "partciularly" should read --particularly--; line 44, "material" should read --materials--.

Column 8, line 16, insert --procedure--.

Column 10, line 61, after Resist insert --and--.

Column 11, line 51, "copolymer" should read --copolyester--.

Signed and sealed this 27th day of November 1973.

(SEAL)
Attest:

EDWARD M.FLETCHER,JR.
Attesting Officer

RENE D. TEGTMEYER
Acting Commissioner of Patents